United States Patent
Fu et al.

(10) Patent No.: US 6,423,653 B1
(45) Date of Patent: Jul. 23, 2002

(54) REDUCTION OF PLASMA DAMAGE FOR HDP-CVD PSG PROCESS

(75) Inventors: Chu-Yun Fu, Taipei; Syun-Ming Jang, Hsin-Chu, both of (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/480,271

(22) Filed: Jan. 11, 2000

(51) Int. Cl.[7] .................... G01R 31/26; H01L 21/311; H01L 21/4763; H01L 21/31
(52) U.S. Cl. .................... 438/788; 438/17; 438/624; 438/631; 438/695; 438/778
(58) Field of Search .................... 438/16–18, 624, 438/631, 695, 759, 771, 777–778, 788, 787

(56) References Cited

U.S. PATENT DOCUMENTS

| | | | |
|---|---|---|---|
| 5,621,241 A | 4/1997 | Jain | 257/632 |
| 5,679,606 A | 10/1997 | Wang et al. | 437/195 |
| 5,800,621 A | 9/1998 | Redeker et al. | 118/723 AN |
| 5,814,564 A | 9/1998 | Yao et al. | 438/723 |
| 5,913,140 A * | 6/1999 | Roche et al. | 438/624 |
| 6,114,182 A * | 9/2000 | Tabara | 438/17 |

OTHER PUBLICATIONS

C.Y. Chang et al., "ULSI Technology", The McGraw–Hill Companies, Inc., New York, NY, 1996, p. 423.

* cited by examiner

Primary Examiner—Ha Tran Nguyen
(74) Attorney, Agent, or Firm—George O. Saile; Stephen B. Ackerman

(57) ABSTRACT

A method for significantly reducing plasma damage during the deposition of inter-layer dielectric (ILD) gapfills on topographic substrates by high density plasma chemical vapor deposition (HDP-CVD). The method can also be applied to the deposition of dielectric layers on silicon oxide covered substrates. The method provides a modification of current state of the art practices in HDP-CVD by a novel variation in the RF input power to the plasma processing chamber during certain portions of the processing cycle. Specifically, top/side RF power is reduced from 3000W/4000W to 1300W/3100W during the heat-up portion of the cycle and plasma lift is eliminated during the wafer release and lift portion of the cycle by turning off the 1000W/2000W top/side RF power. A method for determining the degree of plasma induced damage by measurement of a flatband voltage is also provided.

14 Claims, 2 Drawing Sheets

US 6,423,653 B1

REDUCTION OF PLASMA DAMAGE FOR HDP-CVD PSG PROCESS

BACKGROUND OF THE INVENTION

1. Field of the Invention

The present invention is a method for depositing a a phospho-silicate glass (PSG) inter-layer dielectric (ILD) gapfill on topographic substrate layers employed within microelectronics fabrications of 0.15 micron and beyond device generations. Specifically, this method employs a high density plasma chemical- vapor deposition (HDP-CVD) process, modified so as to produce a significantly reduced degree of plasma damage and a concurrently smaller likelihood of device shifts and failures.

2. Description of the Related Art

Semiconductor integrated circuit microelectronics fabrications are formed from layered semiconductor substrates upon whose surfaces metallic lines are deposited in complex topographic patterns. In the newest generation of such fabrications, the heights and widths of these lines and the spacings between them can be 0.15 microns and less. The deposition of various types of dielectric materials over these substrate layers and metallic patterns is required both to isolate them from subsequent overlays of new substrates and patterns and to produce the necessary device structures from the patterns themselves. In the earlier generation of devices, in which lines and spacings were of the order of 0.5 microns to 0.6 microns, the interlayer dielectric deposition of dielectrics such as boron- phosphorus doped silicate glass (BPSG) were carried out using sub-atmospheric chemical vapor deposition (SA-CVD) methods. While these techniques were adequate for those device sizes, the 0.15 $\mu$m and smaller dimensions characterizing the most recent generation of devices require newer processes such as HDP-CVD. Not only does the plasma enhanced deposition provide a better gapfill for the smaller spacings, due to its combined sputtering and plasma-enhanced deposition nature, but the deposited layer is denser than that produced by SA-CVD and requires no additional annealing steps in the process. A state of the art plasma deposition device having a plasma processing chamber configured with top and side antenna coils for RF tuning and coupling to the plasma is described by Redeker et al, U.S. Pat. No. 5,800,621. C. Y. Chang and S. M. Sze ("ULSI Technology," McGraw-Hill Co's, Pub., New York, 1996, page 423) remark of HDP-CVD deposition that: "Because of the ideal properties of ILD and gap filling, the HDP oxide will become the dominating ILD process for devices 0.35 $\mu$m and below." It has been demonstrated that ILD layers deposited by HDP-CVD can be effectively planarized for the subsequent microcircuit fabrication (see Yao et al. in U.S. Pat. No. 5,814,564). It has also been demonstrated that HDP-CVD gap-fill layers deposited in a stack conformation can lead to enhanced planarity and throughput (see Jain, U.S. Pat. No. 5,621,241).

Notwithstanding the demonstrable positive attributes of HDP-CVD, the method raises the problem of damage to the metal lines during deposition with corresponding subsequent shifts in device properties and even complete device failures. Plasma deposition damage results primarily from the impact energies of the ionized reactant species being deposited on the substrate and metal lines. These energies, in turn, are extremely difficult to control, as they are a result of two factors: the RF fields ionizing and heating the plasma and the bias potential of the substrate relative to the ionized species.

It is recognized that there is a need to find a mechanism to substantially reduce the effects of plasma damage in HDP-CVD. One such method, involving the growth of an intermediate protective layer between the metallized substrate and the HDP deposited ILD, is described by Wang et al. (U.S. Pat. No. 5,679,606.) The present invention is a method for reducing the damage caused by HDP-CVD by a novel variation in the schedule of energies supplied to the wafer (substrate) and plasma during the actual deposition process.

SUMMARY OF THE INVENTION

A first object of this invention is to provide a method for producing high density plasma chemical vapor deposition (HDP-CVD) of inter-layer dielectrics (ILD) while substantially reducing the concurrent degree of device damage encountered in the present state of the art.

A second object of this invention is to provide such a method that operates solely within the context of the actual deposition and does not require intermediate processes such as the prior deposition of buffering or insulating layers.

In accord with the objects of the present invention, there is provided is a method for producing gap filling inter-layer dielectric depositions upon a topographic substrate by high density plasma chemical vapor deposition (HDP-CVD) applied in such a manner as to produce said deposition with a resulting significant reduction of plasma deposition induced damage.

In accord with the objects of the present invention there is provided a new schedule of RF power inputs transferring power to the plasma within the chamber of a plasma deposition device in a series of steps that results in said deposition which significantly reduces the damage to the substrate produced by the energetic deposition species that impact said substrate. This new schedule, which differs from that utilized in the current state of the art for HDP-CVD, is shown to significantly reduce the HDP-CVD damage resulting from ion impacts to the substrate.

In accord with the objects of the present invention there is provided a method for producing dielectric depositions upon a substrate having a silicon oxide layer by high density plasma chemical vapor deposition (HDP-CVD) applied in such a manner as to produce said deposition with a resulting significant reduction of plasma deposition induced damage.

In accord with the objects of the present invention there is provided a method for determining the amount of plasma damage produced by a high density plasma chemical vapor deposition (HDP-CVD) and evaluating the efficacy of the particular method of producing said deposition, using a measurement of a flatband voltage as an indicator of the amount of damage.

The method of the present invention may be employed where the microelectronics fabrication is a semiconductor integrated circuit microelectronics fabrication and the topographic substrate consists of a configuration of metal lines and spaces requiring an inter-layer dielectric gapfill produced by HDP-CVD utilizing state of the art plasma deposition apparatus.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention is a method for producing gap filling inter-layer dielectric depositions upon a topographic substrate by high density plasma chemical vapor deposition (HDP-CVD) applied in such a manner as to produce said deposition with a resulting significant reduction of plasma-deposition produced damage. The advantages of the method will be apparent when it is employed in the fabrication of multi-layer, microelectronic devices of 0.15 microns and beyond, which includes, but is not limited to, semiconductor integrated circuits, solar cell microelectronics fabrications and various types of optoelectronics fabrications.

Figure 1:
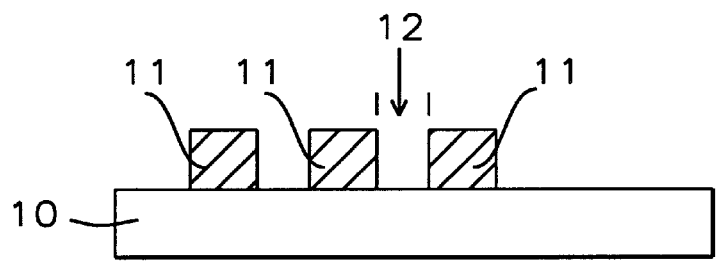
FIG. 1, FIG. 2, and FIG. 3 show a series of schematic cross-sectional diagrams illustrating the results of forming on a topographic substrate, within a microelectronics fabrication in accord with a preferred embodiment of the present invention, a planarized inter-layer dielectric gapfill deposited by a high-density plasma chemical-vapor deposition process while employing the method of the present invention.
Figure 2:
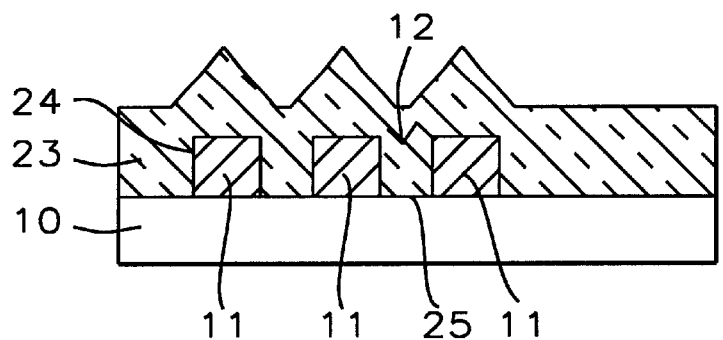
Figure 3:
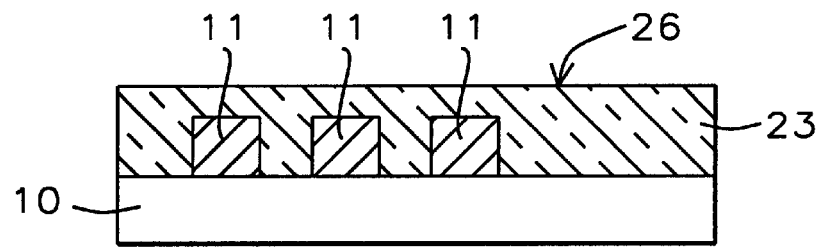

Referring now to FIG. 1, FIG. 2 and FIG. 3, there is shown a series of schematic cross-sectional diagrams illustrating the results of forming, within a microelectronics fabrication in accord with a preferred embodiment of the present invention, a planarized inter-layer dielectric (ILD) gapfill, such as, but not limited to phospho-silicate glass (PSG), deposited on a topographic substrate, which may be a semiconductor substrate, a dielectric substrate or a substrate composed of dielectric and semiconductor regions, by a high-density plasma chemical-vapor deposition process (HDP-CVD) while employing the method of the present invention. FIG. 1 shows said substrate (10) prior to deposition of the inter-layer dielectric gapfill. Upon this substrate, there is a topographic configuration of metal lines, depicted here in cross-section as mesas (11) that rise above the substrate and are separated by spaces (12). Note that the simplicity of this configuration is for illustrative purposes and is in no way meant to limit or restrict the applicability of this embodiment to any specific complexity of topographic structure. The smallest heights, widths and spacings of and between the mesas are of the order of 0.15 microns, characteristic of the most recent generation of microelectronic devices, although heights, widths and spacings can vary between 0.15 microns and 0.25 microns.

FIG. 2. shows the cross-section of the same topographically configured substrate (10) illustrated in FIG. 1, on which a typical inter-layer dielectric (ILD) gapfill (23), such as, but not limited to, phospho-silicate glass (PSG), has been deposited by high density plasma chemical vapor deposition (HDP-CVD), in accord with a preferred embodiment of the present invention. Said inter-layer dielectric gapfill (23) is shown blanketing the topographic configuration of metal lines, which are depicted here in cross-section as mesas (11) that rise above the substrate and are separated by spaces (12). The ILD gapfill will be deposited to a typical thickness of 10,000 Å (angstroms), although thicknesses between 9000 Å and 12,000 Å are common.

A deposition rate:sputter rate ratio is chosen to optimize the gapfill between the mesas and to allow the ILD to be subsequently planarized to provide both a flat field for lithography depth-of-focus and for the effective deposition of additional topographic layers.

The HDP-CVD, if practiced using current state of the art methods, but not in accordance with the method of the present invention as set forth herein, will produce damage along the ILD interface with the metal mesas (11) and along the ILD interface with the substrate (25) as a result of the high energy impacts of the ionized species being deposited, such as those involved in the HDP-CVD deposition of phospho-silicate glass (PSG). Such damage is of particular concern when it occurs along the interface (24) with the mesas (i.e., along the metal lines), where it can produce device damage and device failures. When the HDP-CVD is practiced in accord with the method of the present invention as set forth in this preferred embodiment, however, said damage will be significantly reduced.

FIG. 3 is an illustration of the results of the inter-layer dielectric gapfill (23) as deposited by the method of the present invention subsequent to a planarization (26). The planarization may be accomplished by the use of a chemical mechanical polish (CMP) or other methods applied in accordance with the current state of the art for microelectronics fabrications. Said planarization, when applied to the inter-layer dielectric gapfill deposited according to the method of the invention as set forth herein, will be formed with optimal uniformity and planarity as required for the effective deposition of additional dielectric layers.

Figure 4:
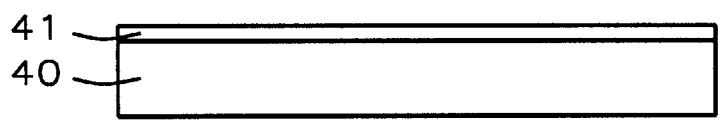
FIG. 4 and FIG. 5 show a series of schematic cross-sectional diagrams illustrating the results of forming an inter-layer dielectric on a substrate on which a silicon oxide layer has been deposited. Said inter-layer dielectric is deposited on the silicon oxide layer by a high-density plasma chemical-vapor deposition process while employing the method of the present invention in accord with a preferred embodiment of the present invention.
Figure 5:
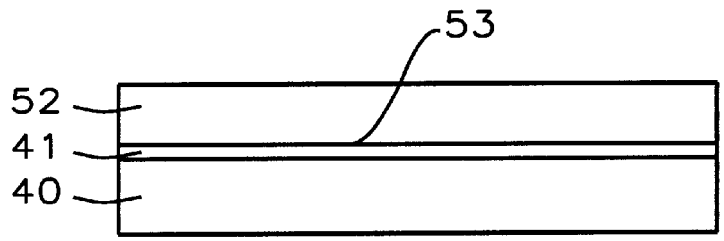

Referring now to FIG. 4 and FIG. 5, there is shown a series of cross-sectional diagrams illustrating the deposition of an inter-layer dielectric by high-density plasma chemical vapor deposition in accord with the preferred embodiment of the method of the present invention on a substrate on which has already been deposited a layer of silicon oxide of approximate thickness between 200 Å and 400 Å.

FIG. 4 shows the cross-section of the substrate (40) and silicon oxide layer (41) prior to the inter-layer dielectric deposition.

FIG. 5 shows the cross-section of said substrate (40) and silicon oxide layer (41) upon which has been deposited an inter- layer dielectric (52) of approximately 2000 Å thickness by high-density plasma chemical vapor deposition (HDP-CVD) according to the preferred embodiment of the present invention. Deposition of such inter-layer dielectric by (HDP-CVD) in a manner not in accord with the method of the present invention would lead to significant plasma induced damage along the interface (53) between the deposited dielectric and the silicon oxide.

Figure 6:
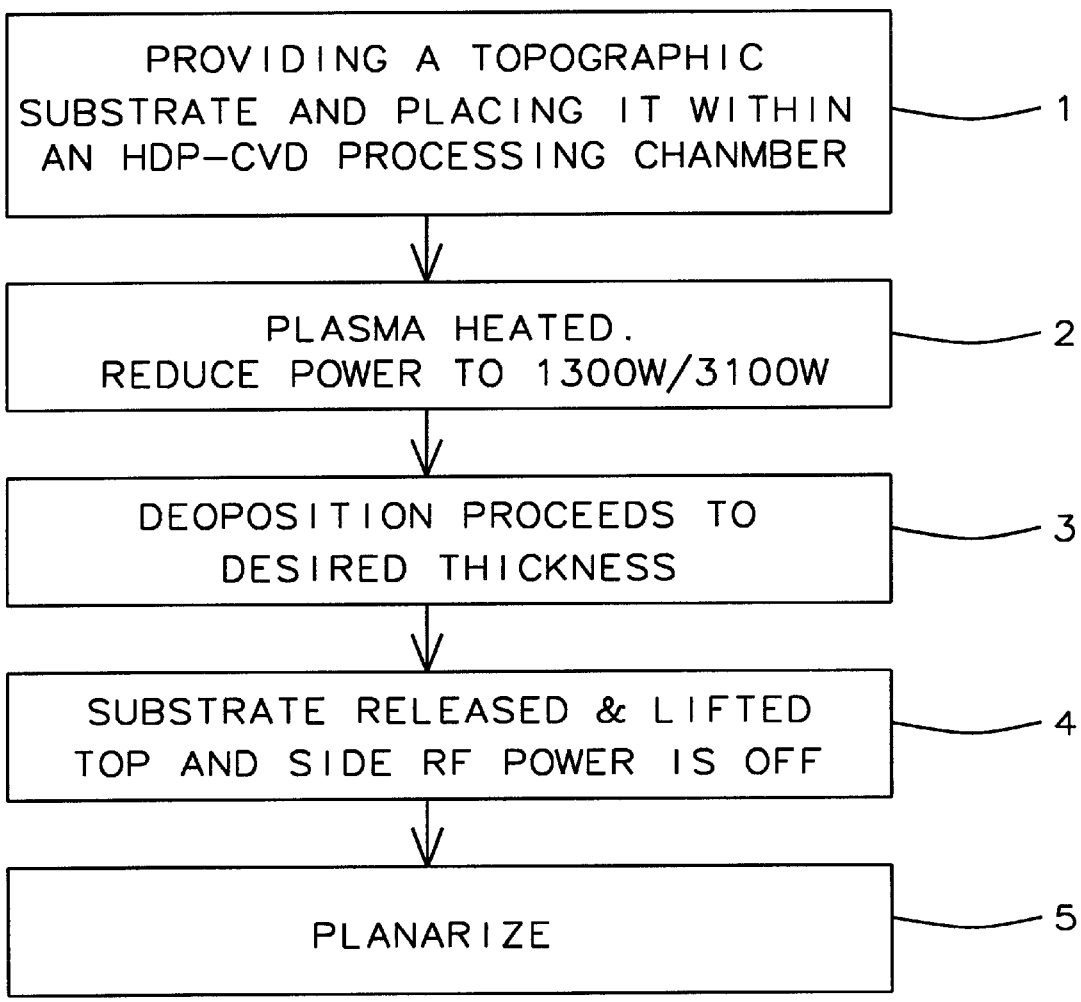
FIG. 6 is a flowchart illustrating a series of steps such as would be employed in accord with a preferred embodiment of the present invention. Said steps illustrated in the flowchart of FIG. 6 are characteristic of the steps employed in accord with said preferred embodiment in forming the planarized inter-layer dielectric gapfill illustrated in schematic cross-section FIG. 1, FIG. 2 and FIG. 3 described above and in depositing the inter-layer dielectric illustrated in schematic cross-section in FIG. 4 and FIG. 5.

FIG. 6 is a schematic representation in the form of a flowchart of the method of the invention described in this preferred embodiment. The steps delineated in said flowchart constitute a preferred embodiment of the present invention, a method of depositing an inter-layer dielectric gapfill on a topographic substrate, which may be a semiconductor substrate, a dielectric substrate or a substrate composed of dielectric and semiconductor regions, by a high-density plasma chemical-vapor deposition process, with a significant reduction in plasma induced damage. The steps delineated in FIG. 6 thereby illustrate the process by which is formed the fabrication shown schematically in the series of figures, FIG. 1, FIG. 2 and FIG. 3 discussed above, as well as the inter-layer dielectric deposition shown schematically in FIG. 4 and FIG. 5.

Referring to FIG. 6, we have the following sequence of steps, denoted in the figure as (1), (2), (3), (4) and (5) and described as follows.

(1) Providing a topographic substrate having metallic mesas with spaces between them, such as is illustrated schematically in cross-section in FIG. 1 and placing said substrate within a high density plasma-chemical vapor deposition (HDP-CVD) processing chamber.

(2) Heating said substrate with top and side coil RF power of the plasma processing chamber. RF power is reduced during the heat-up step from top/side power of 3000W/ 4000W to 1300W /3100W.

(3) Depositing an inter-layer dielectric gapfill, with RF power to top and side coils in the range of 1000W-1500W to the top coil and 1000W-1500W to the side coil, until desired thickness is achieved. Inter-layer dielectric gapfill now blankets the topographic substrate in the manner depicted schematically in cross-section in FIG. 2

(4) Releasing and lifting of substrate. All RF power to the top and side RF coils of the HDP-CVD processing chamber is turned off.

(5) Planarizing inter-layer dielectric gapfill in accord with generally acceptable methods such as chemical mechanical polish (CMP), producing a result indicated schematically in FIG.3.

The significant reduction of HDP-CVD process associated plasma damage has been substantiated by the measurement of flatband voltages ($V_{fb}$) subsequent to processing. Specifically, flatband voltages in three different dielectric film stack configurations have been measured using the Quantox measuring tool. A reduction in $V_{fb}$ is an indication of reduced plasma damage. The film configurations and the processes by which they were produced are as follows.

Stack 1. Silicon substrate with a thermal oxide layer of thickness between 200 Å and 400 Å. The configuration of Stack 1 is illustrated schematically in FIG. 4.

Stack 2. Silicon substrate with 200 Å to 400 Å thermal oxide layer over which is deposited a 2000 Å layer of HDP-CVD PSG using the standard state of the art top/side RF power of 3000W /4000W during heat-up, a positive electrostatic chuck (ESC) to hold the substrate and plasma lift. The resulting configuration produced in Stack 2 is illustrated schematically in FIG. 5.

Stack 3. Silicon substrate with thermal oxide layer of thickness between 200 Å and 400 Å over which is deposited 2000 Å of HDP-CVD PSG utilizing the method of the present invention, top/side RF power of 1300W /3100W during heat-up, positive ESC and no plasma lift (no plasma lift meaning turning off both top and side RF power during the subtrate release and lift). The configuration of Stack 3 is the same as that illustrated in FIG. 5.

Measurements made subsequent to the formation of these three stack configurations yield the following tabulated results, where $V_s$ is surface voltage, $\Delta V_s$ is the difference between the maximum and minimum surface voltage measured within the subtrate, $V_{fb}$ is the flatband voltage and $\Delta V_{fb}$ is the difference between the maximum and minimum flatband voltages measured within the substrate.

| Film Stack | $v_s(v)$ | $\Delta v_s(v)$ | $v_{fb}(v)$ | $\Delta v_{fb}(v)$ |
| --- | --- | --- | --- | --- |
| 1 | −0.35 | 0.136 | −0.493 | 0.104 |
| 2 | 5.722 | 2.308 | −22.618 | 5.712 |
| 3 | 5.044 | 3.113 | −16.437 | 1.902 |

The method of the present invention may be employed where the microelectronics fabrication is a semiconductor integrated circuit microelectronics fabrication and the topographic substrate consists of a configuration of metal lines and spaces requiring an inter-layer dielectric gapfill produced by HDP-CVD utilizing state of the art plasma deposition apparatus.

As is finally understood by a person skilled in the art, the preferred embodiment of the present invention is illustrative of the present invention rather than limiting of the present invention. Revisions and modifications may be made to methods, materials, structures and dimensions through which is formed a gap filling inter-layer dielectric deposition upon a topographic substrate by high density plasma chemical vapor deposition (HDP-CVD) applied in such a manner as to produce said deposition with a resulting significant reduction of plasma deposition induced damage in accord with the preferred embodiment of the present invention, while still providing the formation of a gap filling inter-layer dielectric deposition upon a topographic substrate by high density plasma chemical vapor deposition (HDP-CVD) applied in such a manner as to produce said deposition with a resulting significant reduction of plasma deposition induced damage fabrication in accord with the present invention as provided by the appended claims.

What is claimed is:

1. A method for producing gap filling inter-layer dielectric depositions upon a topographic substrate by high density plasma chemical vapor deposition (HDP-CVD) applied in such a manner as to produce said deposition with a reduction of plasma deposition induced damage comprising:

providing said topographic substrate;

forming upon said topographic substrate a blanket dielectric gap filling layer of thickness between 9000 Å and 12,000 Å, by a plasma enhanced simultaneous bias sputtering and deposition method applied within the substrate processing chamber of a plasma processing device equipped with top and side source coils capable of supplying RF power to the plasma and an electrostatic chuck for holding the substrate in place and supplying to said substrate an electrostatic bias for the deposition; and transferring power to the plasma within the chamber in a series of steps further comprising:

a substrate heating step, during which step top and side coil RF power to the plasma processing chamber is reduced from a first top/side coil RF power level to a second top/side coil RF power level; followed by an inter-layer gap filling dielectric deposition step, during which step top and side coil RF power levels are maintained at a constant third level range until a desired value of said dielectric deposition thickness is achieved; followed by a release and lift step of said substrate during which step all RF power to the top and side RF coils is turned off.

2. The method of claim 1 wherein the topography of the topographic substrate comprises mesas of substantially equivalent heights and widths. the height of said mesas being between about 1500 Å and 2000 Å, the widths of said mesas being between about 1000 Å and 2000 Å and wherein the spacings between said mesas are between about 1500 Å and 2500 Å.

3. The method of claim 1 wherein said method is a microelectronics fabrication method for fabricating semiconductor integrated circuit microelectronics.

4. The method of claim 1 wherein said topographic substrate is selected from the group consisting of topographic conductor substrates, topographic semiconductor substrates, topographic insulator substrates, and composites thereof.

5. The method of claim 1, wherein such deposited inter-layer gapfill dielectric is of sufficient thickness to be planarized for subsequent dielectric depositions or topographic depositions.

6. The method of claim 1 wherein the first top/side coil RF power level is 3000W/4000W and the second top/side coil RF power level is 1300W/3100W.

7. The method of claim 1 wherein the third top/side coil RF power level range is between 1000W and 1500W.

8. A method for producing dielectric depositions upon a substrate having a silicon oxide layer by high density plasma chemical vapor deposition (HDP-CVD) applied in such a manner as to produce said deposition with a resulting significant reduction of plasma deposition induced damage, comprising:

providing a substrate on which has been deposited a silicon oxide layer of between 200 Å and 400 Å;

forming upon said silicon oxide layer by high density plasma chemical vapor deposition a dielectric layer of thickness between 2000 Å and 3000 Å within the substrate processing chamber of a plasma processing device, such plasma processing device being equipped with top and side source coils capable of supplying RF power to the plasma and an electrostatic chuck for holding the substrate in place and supplying to said substrate an electrostatic bias for the deposition; and transferring power to the plasma within the chamber in a series of steps further comprising:

a substrate heating step, during which step top and side coil RF power to the plasma processing chamber is reduced from a first top/side coil RF power level to a second top/side coil RF power level; followed by an inter-layer gap filling dielectric deposition step, during which step top and side coil RF power levels are maintained at a constant third level range until a desired value of said dielectric deposition thickness is achieved; followed by a release and lift step of said substrate during which step all RF power to the top and side RF coils is turned off.

9. The method of claim 8 wherein said method is a microelectronics fabrication method for fabricating semiconductor integrated circuit microelectronics.

10. The method of claim 8 wherein said silicon oxide covered substrate layer is selected from the group consisting of topographic conductor substrate layers, topographic semiconductor substrate layers, topographic insulator substrate layers, and composites thereof.

11. The method of claim 8 wherein the first top/side coil RF power level is 3000W/4000W and the second top/side coil RF power level is 1300W/3100W.

12. The method of claim 8 wherein the third top/side coil RF power level range is between 1000W and 1500W.

13. A method for determining the amount of plasma damage produced by a high density plasma chemical vapor deposition (HDP-CVD) and evaluating the efficacy of the particular method of producing said deposition, using a measurement of a flatband voltage as an indicator of the amount of damage, comprising:

providing a substrate which has been thermally a silicon oxide of thickness between 200 Å and 400 Å;

measuring the flatband voltage of said oxide coated substrate;

using said measured flatband voltage as a control value for said oxide coated substrate which has not been subjected to high density plasma chemical vapor deposition (HDP-CVD);

processing said oxide coated substrate in the plasma processing chamber whose performance is to be evaluated and depositing a dielectric layer by HDP-CVD upon the thermal oxide to form a structure;

measuring the flatband voltage of said structure and comparing it to said control value to obtain a compared value;

using said compared value as a measure of the damage caused by the HDP-CVD process.

14. The method of claim 11, wherein the flatband voltage is determined by use of the Quantox measuring tool.

* * * * *